United States Patent [19]

Long et al.

[11] Patent Number: 4,604,798
[45] Date of Patent: Aug. 12, 1986

[54] EXTRACTOR FOR SPRING-LOCK PIN CONNECTORS

[75] Inventors: James R. Long, Madison; James A. Kerr, Huntsville, both of Ala.

[73] Assignee: The United States of America as represented by the Secretary of the Army, Washington, D.C.

[21] Appl. No.: 626,520

[22] Filed: Jun. 29, 1984

[51] Int. Cl.⁴ .............................................. B23P 19/04
[52] U.S. Cl. ........................................ 29/764; 29/762; 29/426.6; 29/256
[58] Field of Search ............... 29/762, 764, 278, 426.1, 29/426.4, 426.5, 426.6, 256, 258–262; 339/217 S

[56] References Cited

U.S. PATENT DOCUMENTS

| | | | |
|---|---|---|---|
| 543,652 | 7/1895 | Palm | 29/260 |
| 3,158,424 | 11/1964 | Bowen | 339/217 S |
| 3,443,297 | 5/1969 | Lusby, Jr. | 29/764 |
| 3,951,514 | 4/1976 | Medina, Jr. | 29/764 |
| 4,155,159 | 5/1979 | Hogan et al. | 29/764 |
| 4,215,468 | 8/1980 | Greco | 29/764 |
| 4,468,858 | 9/1984 | Gulberg et al. | 29/278 |

FOREIGN PATENT DOCUMENTS 2055322 3/1981 United Kingdom ................. 29/764

Primary Examiner—Howard N. Goldberg
Assistant Examiner—P. W. Echols
Attorney, Agent, or Firm—Anthony T. Lane; Robert P. Gibson; Harold W. Hilton

[57] ABSTRACT

Apparatus for removal of connectors from printed circuit boards. The connectors have spring-lock type of conductor pins therein which secure the connectors to the printed circuit board in substantially permanent relation and if some conductor pins were to become defective the whole printed circuit board would be thrown away. The device of the present invention is disposed for removal of the connectors from the printed circuit board without causing damage to the board.

1 Claim, 5 Drawing Figures

EXTRACTOR FOR SPRING-LOCK PIN CONNECTORS

DEDICATORY CLAUSE

The invention described herein may be manufactured, used, and licensed by or for the Government of governmental purposes without the payment to us of any royalties thereon.

BACKGROUND OF THE INVENTION

A typical printed board assembly includes a plurality of circuits disposed on the board in predetermined relation and connector having a plurality of pin conductors therein for connection to predetermined conductors of the circuits. In the assembly of the present board, connectors are secured to the printed circuit board and the pin conductors are secured in the connector by a spring snap-lock and the conductors include a lower tip which is soldered to the circuit board to secure the connector to the board in nearly permanent relation. In the past, such boards with damaged connectors have been thrown away, because of the substantially permanent connection of the connectors to the board, and replaced by new boards. This is an expensive procedure.

It is therefore, an object of the present invention to provide a puller mechanism for removing a connector housing from a printed circuit board without damage to the connector or the printed cricuit board.

SUMMARY OF THE INVENTION

An extractor assembly to remove a connector body from a printed circuit board assembly in which a conductor is spring locked in the connector and soldered to the printed circuit board. A device is provided for release of each spring locked conductor in the connector prior to removal of the connector from the printed circuit board. An extractor assembly includes a pair of members for gripped engagement of the connector body along the sides thereof and a screw mechanism is provided to move the members upward for disengagement of the connector from the printed circuit board.

DESCRIPTION OF THE PREFERRED EMBODIMENT

Figure 1:
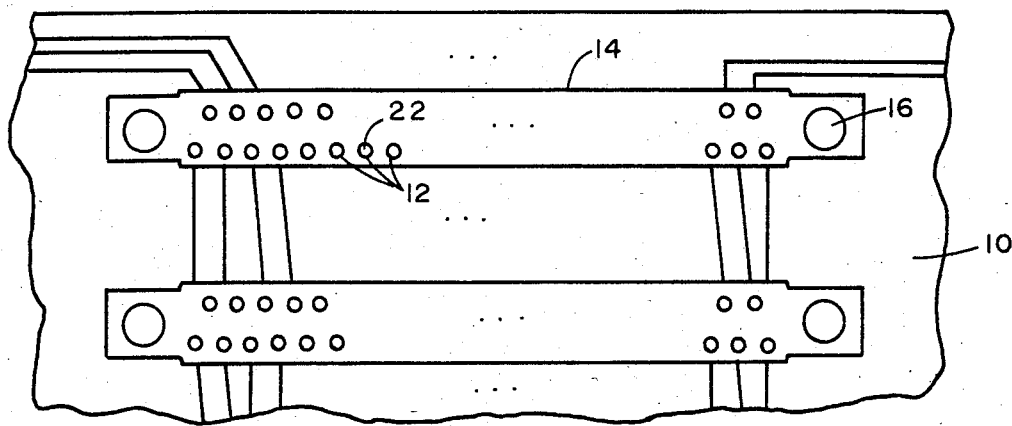
FIG. 1 is a partial plan view of a printed circuit board having connectors thereon.

As seen in FIG. 1 a printed circuit board 10 includes a plurality of conductors 12 secured to predetermined circuits of the printed circuit board. The conductors are carried in a phenolic connector 14 which is secured to board 10 by screws 16 and by glueing, if desired. The conductors 12 include a lower tip portion 18 (FIG. 2) which is soldered to the circuit and a upper portion 20 having openings 22 therein (FIG. 1) to receive a pin insert from a connector (not shown) of another circuit to be connected to printed circuit board 10.

Figure 2:
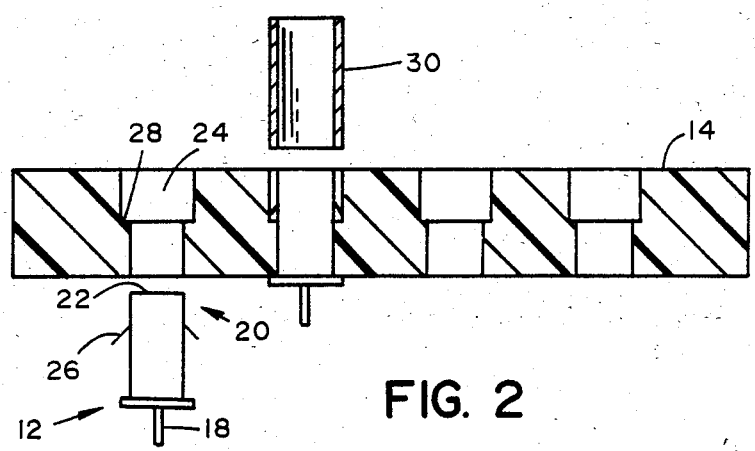
FIG. 2 is a sectional view of a typical connector and spring lock conductors therefor. The view also illustrates a collar for release of the spring from engagement with the connector body.

FIG. 2 illustrates a sectional view of connector 14 and illustrates a conductor 12 for insertion in holes 24 of the connector and a second conductor 12 inserted in hole 24. The conductor includes a spring lock 26 which seats against a shoulder 28 of hole 24. As can be seen in FIG. 2 when spring lock conductor 12 is inserted in opening 24, the spring lock 26 snap locks on shoulder 28 for secured relation therein. Tip 18 is soldered to the underside of the printed circuit board.

Figure 3:
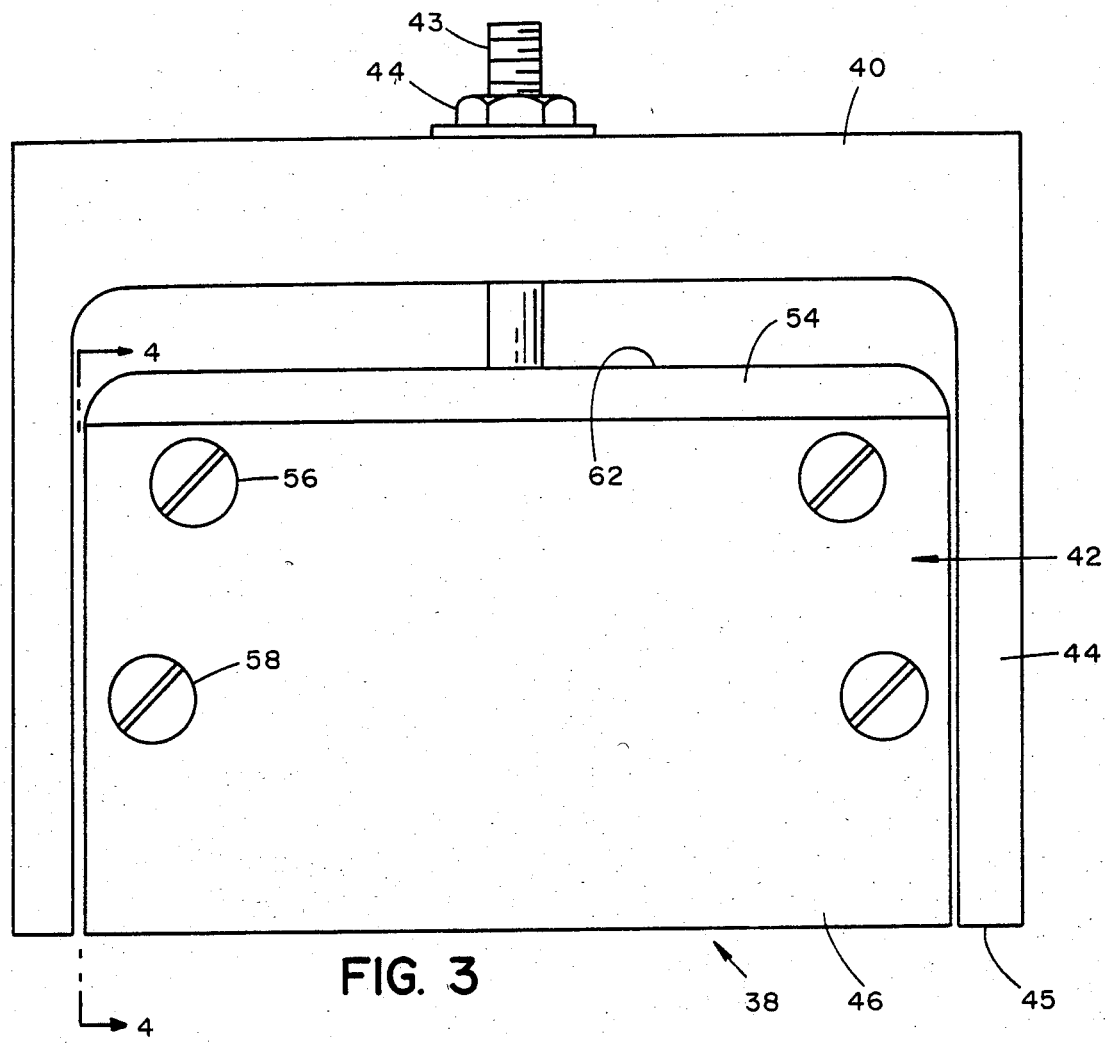
FIG. 3 is a side elevational view of the extractor assembly of the present invention.

To remove the connector 14 from the printed circuit board to permit repair of a connection, an extractor assembly 38 (FIG. 3) and sleeve 30 (FIG. 2) are provided.

The extractor 38 (FIGS. 3 and 4) includes a housing 40 having an extractor member 42 therein. An extractor member guide 44 is formed by a pair of legs extending from housing 40. An adjustable screw 43 having a nut 44 thereon extends through housing 40 and is secured to extractor member 42.

Figure 4:
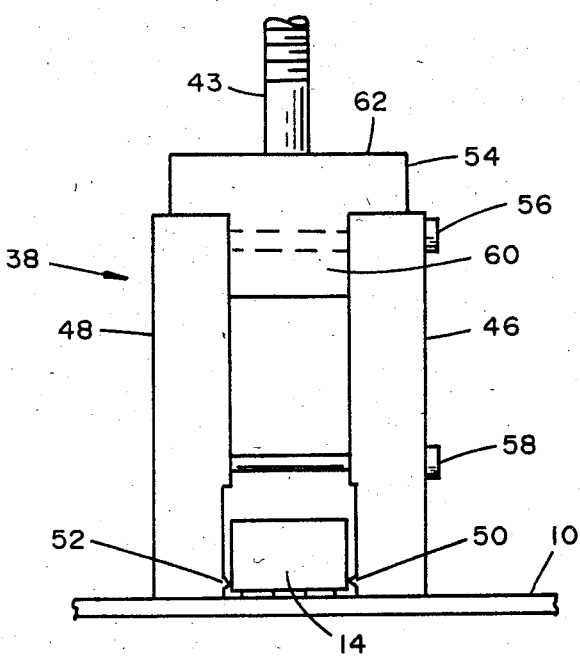
FIG. 4 is an end elevational view of the extractor body taken along line 4—4 of FIG. 3.

As more clearly seen in FIG. 4 the extractor 38 having the housing removed for clarity is provided with a pair of plates 46 and 48 having projections (ridges) 50 and 52 thereon which extend along the length of the plates. The plates are secured to upper body member 54 by a pair of screws 56. A second pair of screws 58 is provided to apply pressure to plates 46 and 48 for inward movement thereof. Body member 54 includes a lower portion 60 to which plates 46 and 48 are secured and an upper surface 62 having adjustable screw 43 secured thereto. A connector 14 is shown in the extractor 38.

Figure 5:
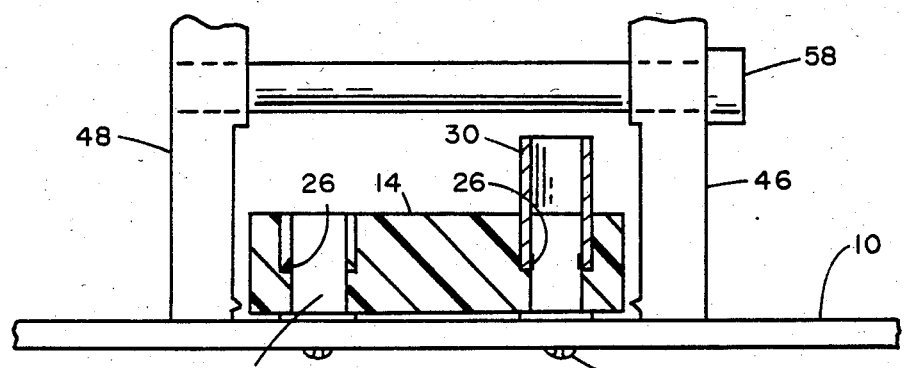
FIG. 5 is an enlarged partial view of the extractor body positioned over a connector prior to removal thereof from the printed circuit board.

As seen in enlarged FIG. 5, a connector is in extractor 38 prior to the plates 46 and 48 being in engagement with connector 14. The conductor is seen to be soldered at 64 to board 10. The figure illustrates (for illustrative purposes only) the position of a conductor 12 having snap lock 26 in engaged relation in the connector 14. The figure also shows what actually happens prior to operation of extractor 38, that is, collar 30 is inserted in all openings 24 of the connector to compress snap locks 26. After the snap locks 26 have been compressed, screws 58 are tightened to bring projections (ridges) 50 and 52 into engagement with connector 12 (FIG. 4). Rotation of nut 44 on screw 43 moves extractor body 42 upward for upward movement of connector 14. During the extraction operation lower surfaces 45 of legs 44 rest on the upper surface of printed circuit board 10 adjacent the opposite ends of connector 14. Prior to the extraction operation, screws 16 are removed from the connector.

A typical printed circuit board assembly using the snap lock assembly as described herein is manufactured by The Hypertronics Corp., Concord, Mass. 01742.

We claim:

1. Apparatus for removal of connectors having spring-lock type conductor pins therein from printed circuit boards comprising:
    a. means for release of said spring-lock pins from said connectors including collars for engaging springs on said spring-lock pins for compression thereof for disengagement of each spring from said connector;
    b. extractor means for engagement with said connectors along the sides thereof for disengagement of said connectors from said printed circuit boards;

said extractor means including a pair of spaced, downwardly extending members each having a projection along the length thereof for engagement with said connectors along the length thereof and means for moving said members upwardly for disengagement of said connectors from said printed circuit board; said extractor means further including an upper body portion having said pair of spaced members secured thereto and a housing, said means for moving said members upwardly including a threaded shaft secured to said upper body member and extending upwardly through said housing, a nut carried on said threaded shaft in seating engagement with said housing, whereby responsive to rotation of said nut, said pair of members are moved upwardly.

* * * * *